United States Patent [19]

Gutmann

[11] 4,125,869
[45] Nov. 14, 1978

[54] INTERCONNECT LOGIC
[75] Inventor: Manfred Gutmann, Cupertino, Calif.
[73] Assignee: National Semiconductor Corporation, Santa Clara, Calif.
[21] Appl. No.: 595,116
[22] Filed: Jul. 11, 1975
[51] Int. Cl.[2] .............................................. G06F 13/00
[52] U.S. Cl. .................................. 364/900; 307/207; 364/716
[58] Field of Search .................... 235/152; 340/172.5, 340/166 R; 307/203, 207, 221 R; 364/200, 900, 716

[56] References Cited
U.S. PATENT DOCUMENTS

| 3,328,772 | 6/1967 | Oeters | 340/172.5 |
| 3,603,774 | 9/1971 | de Varda et al. | 235/152 |
| 3,611,309 | 10/1971 | Zingg | 340/172.5 |
| 3,755,788 | 8/1973 | Finch | 340/172.5 |
| 3,914,744 | 10/1975 | Brown | 340/172.5 |
| 3,916,175 | 10/1975 | Lauer et al. | 235/152 |

Primary Examiner—Malcolm A Morrison
Assistant Examiner—Errol A. Krass
Attorney, Agent, or Firm—Brown & Martin

[57] ABSTRACT

The interconnect logic circuit for supplying input data to a register and recirculating data in the register includes a programmable logic array (PLA) and a recirculation control circuit connected between an output of the PLA and an input of the register and between an output and an input of the register. The recirculation control circuit includes a first transfer gate for sensing and storing information corresponding to the presence or absence of a command to supply input data, and a second transfer gate connected between an output and an input of the register and responsive to the stored information. The recirculation control circuit also includes a circuit for preventing the input data from being inputted to the PLA during a first time period, such that only a command to load that input data is sensed at an output of the PLA during that first time period. In the absence of a command to load input data into the register, the second transfer gate is enabled during a time period subsequent to the first time period to recirculate data in the register. In the presence of a command to load input data, the second transfer gate is disabled during the subsequent time period, the input data is passed through the PLA, and input data is supplied to the register. A method of channelling data to a register includes the steps of sensing the presence of a command to load input data for supplying such input data to the register, and sensing the absence of such a command to recirculate data in the register.

14 Claims, 13 Drawing Figures

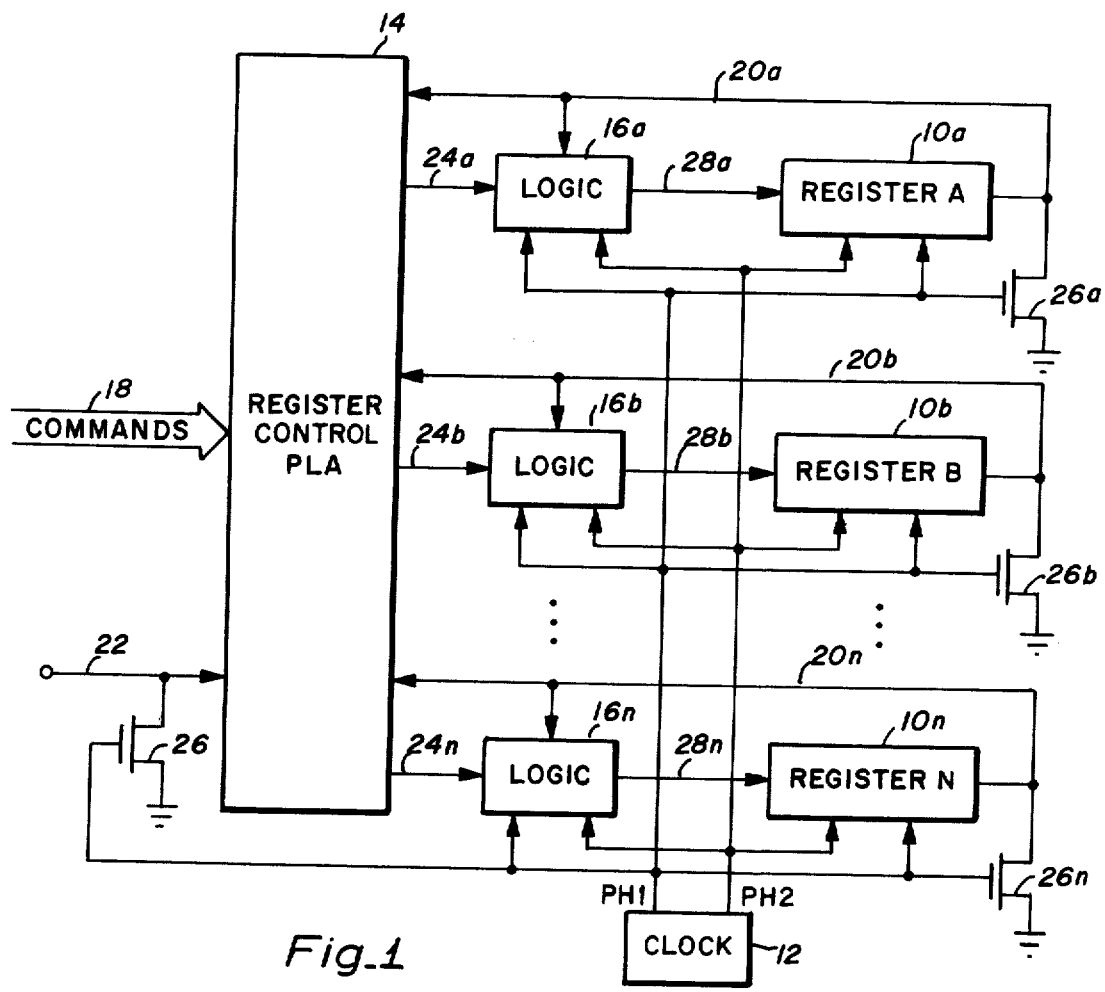
Fig_1
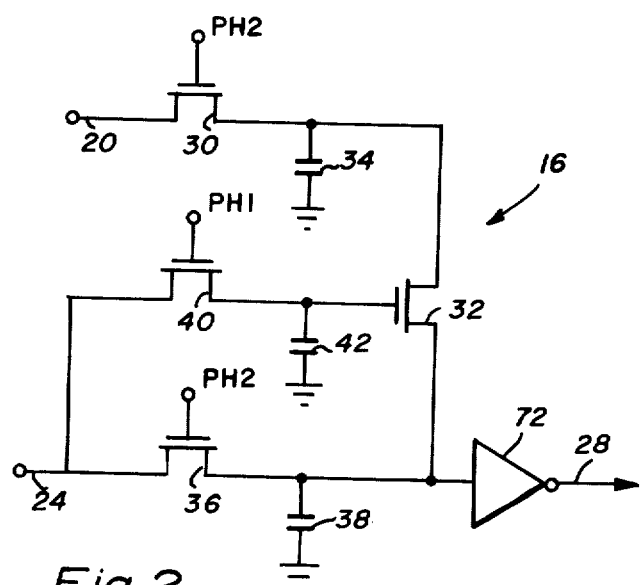
Fig_2

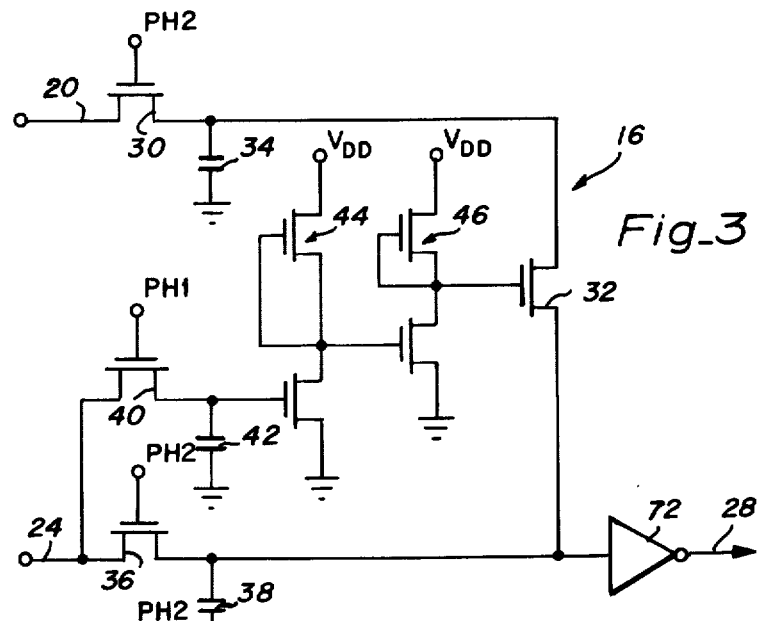
Fig_3
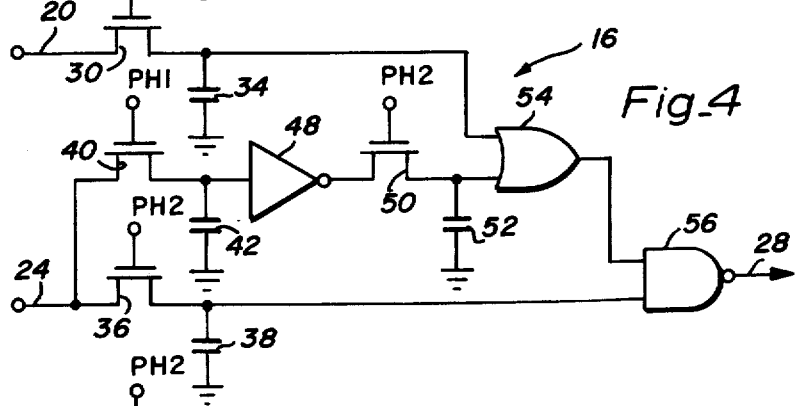
Fig_4
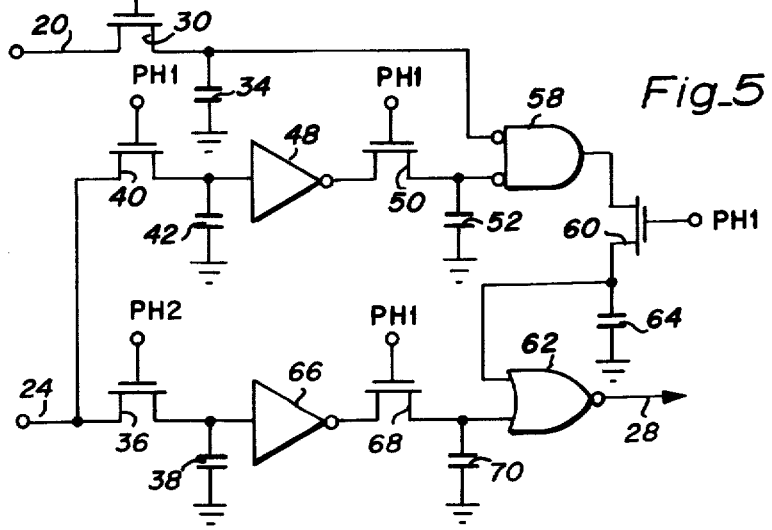
Fig_5

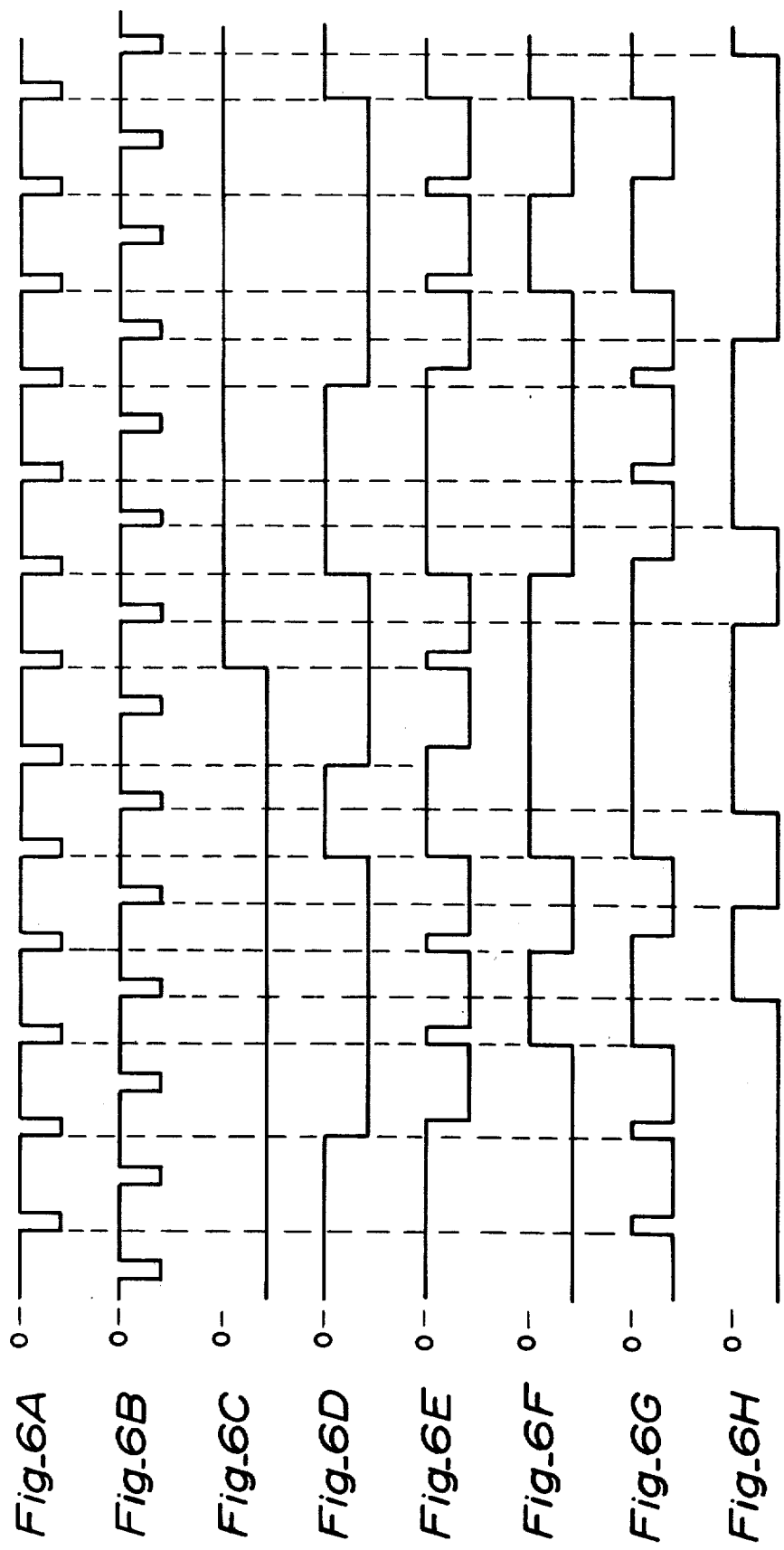

INTERCONNECT LOGIC

BACKGROUND OF THE INVENTION

1. Field of the Invention

This invention relates generally to an apparatus for and method of channelling data into and between a group of registers in, for example, a calculator, and more particularly to such an apparatus and method in which data is automatically recirculated in a register whenever data is not being supplied thereto from another source.

2. Prior Art

Serial processors, and the like machines, employ interconnect logic for decoding and implementing instructions which are generated by a main control unit therein. Generally, the control unit generates such instuctions in response to an address supplied from an external source. Such an external source may include, for example, a keyboard or a macroinstruction storage register and address generator. The instructions generated by the control unit are employed for controlling the flow of data into and out of the storage registers, for controlling the transfer of data between such registers, and for controlling the recirculation of data in those registers.

It has been the practice in the past to design such interconnect logic such that it is dedicated to the particular processor in which it is to be employed. That is, such interconnect logic for a particular processor is designed especially for the particular instructions employed in that processor and the particular functions to be accomplished in the transmission of data into and out of the associated registers. This design philosophy promotes a number of distinct disadvantages which are discussed in greater detail in an application for U.S. Pat. Ser. No. 693,482, which is a continuation application of Ser. No. 584,637 now abandoned of Richard B. Simone, filed June 6, 1975. That application is referred to for a discussion of the problems encountered in the design and implementation of interconnect logic circuits employed in the past.

The invention disclosed in the above mentioned application employs a programmable logic array (PLA) as the interconnect logic between a main control unit and the data handling registers of a serial processor. The technique of employing a PLA as the interconnect logic and which is disclosed in that application for patent dictates that all of the inputs of the registers are connected to respective outputs of the PLA and all of the outputs of the registers are connected to respective inputs of the PLA. Accordingly, when the main control unit supplies instruction codes to appropriate inputs of the PLA, all of the data which will be supplied to the registers is supplied from or through the interconnect PLA. This is also true of any data which is to be recirculated in a particular register. That is, the output of the register in which data is to be recirculated is connected to an appropriate input of the PLA and is supplied therethrough in response to an appropriate command to another input of that PLA.

This technique of recirculating data in a register requires the use of a relatively large and expensive PLA, or the use of additional logic gates external to the PLA which are the equivalent of the logic contained in a PLA to perform the same function. It can be appreciated that a considerable savings in both hardware and, therefore, cost can be realized if such recirculation data need not be transmitted through such a PLA or the equivalent logic circuitry.

SUMMARY OF THE INVENTION

Accordingly, it is an object of the present invention to provide an interconnect logic circuit for supplying data to at least one register, which circuit recirculates data in that register whenever a command to load input data into that register from another source is not present.

Another object of the present invention is to provide an interconnect logic circuit for supplying data to at least one register, which circuit employs a minimum number of logic gates for recirculating data in that register.

Still another object of the present invention is to provide a method of channelling data to a register, such that recirculation of data in that register occurs whenever a command to load input data into that register from another source is not present.

These and other objects of the present invention are attained by an interconnect logic circuit which includes a circuit for supplying data from an output to an input of the register and means for sensing the absence of a command to supply input data from another source into that register for enabling that circuit. The present invention also includes the method of recirculating data in a register whenever a command to supply input data into that register from another source is not present.

A feature of the present invention resides in the use of a pair of timing phase signals which separate the operation of the interconnect logic, such that during a first timing phase a command to load input data from another source can be detected, and during a second timing phase, either that input data is loaded into the register if such a command is present, or data is recirculated in the register if such a command is not present.

Another feature of the present invention resides in the provision of circuit means for disconnecting input data during a first timing phase, such that a command to load that input data can be sensed and stored for use during a subsequent time period. That is, such circuit means separate commands from input data, such that such commands can be sensed and stored.

The invention, however, as well as other objects, features and advantages thereof will be more fully realized and understood from the following detailed description, when taken in conjunction with the accompanying drawings, wherein:

BRIEF DESCRIPTION OF THE DRAWINGS

FIG. 1 is a partial block and partial schematic diagram of a plurality of registers and the interconnect logic for supplying data to those registers which is constructed in accordance with the principles of the present invention.

FIG. 2 is a schematic diagram of one embodiment of the logic circuits illustrated in FIG. 1.

FIG. 3 is a schematic diagram of a second embodiment of the logic circuits illustrated in FIG. 1.

FIG. 4 is a partial logic and partial schematic diagram of a third embodiment of the logic circuits illustrated in FIG. 1.

FIG. 5 is a partial logic and partial schematic diagram of a fourth embodiment of the logic circuits illustrated in FIG. 1.

FIGS. 6A-H are graphical representations of idealized waveforms useful in understanding the operation of the interconnect logic circuit of the present invention.

Like reference numerals throughout the various views of the drawings are intended to designate the same or similar elements.

DETAILED DESCRIPTION OF THE PREFERRED EMBODIMENTS

With reference to FIG. 1, there is shown a plurality of registers 10 which may be part of a serial processor, for example, or the like machine. The registers 10 are employed for storing data which is to be employed in the operation of the processor. In a constructed embodiment of the present invention, the registers 10 are dynamic registers in that data is continuously flowing therethrough. However, it is to be understood that the registers 10 may also be static registers.

A clock 12 supplies a pair of timing phase signals, designated PH1 and PH2, to each of the registers 10. The idealized waveforms of the PH1 and PH2 signals are shown in FIGS. 6A and 6B, respectively. The circuits disclosed herein are P MOS circuits. Accordingly, upon each negative going excursion of the PH1 signal, data is shifted one-half bit in each of the registers 10, and upon each negative going excursion of the PH2 signal, data is shifted one-half bit in each of the registers 10, such that one complete cycle of either of these signals represents one bit time. It is to be understood, of course, that the PH1 and PH2 signals need not be generated by a clock, but may constitute shift signals for shifting the data in the registers 10, and such shift signals need not be periodic.

The interconnect logic circuit of the present invention includes a register control circuit 14 in the form of a programmable logic array (PLA) and a plurality of logic circuits 16. For a discussion of programmable logic arrays, reference is made to the above mentioned application for patent. The register control circuit 14 implements commands supplied from a main control unit (not shown) on a plurality of lines 18 to control the flow of data into and out of the registers 10. The data supplied to a particular one of the registers 10 may be derived from another one of the registers 10 or from an external source. Accordingly, the outputs of each of the registers 10 are connected to respective inputs of the register control circuit 14 on a respective one of a plurality of lines 20. Also, input data from an external source is supplied to an input of the register control circuit 14 on a line 22. The register control circuit 14 effectively performs an ANDing function of each command with the data supplied on a respective one of the lines 20 or 22 to form partial product terms. These partial product terms are effectively ORed by the register control circuit 14 to supply outputs on a respective one of a plurality of lines 24. Data which is to be recirculated in each of the registers 10, however, does not flow through the register control circuit 14, but is supplied from each of the lines 20 directly to a respective one of the logic circuits 16. The outputs of each of the logic circuits 16 are connected to a respective one of the registers 10.

Each of the logic circuits 16 are controlled by the PH1 and PH2 signals. During a first timing phase, as determined by the PH1 signal, each of the logic circuits 16 sense the presence or absence of a command on a respective one of the lines 24. If such a command is present on one of the lines 24 during that first timing phase, the corresponding logic circuit 16 will supply input data to the corresponding register 10 during a second timing phase, as determined by the PH2 signal. However, if such a command is not present on one of the lines 24 during that first timing phase, the corresponding logic circuit 16 will recirculate data in the corresponding register 10 during the immediately succeeding second timing phase. In order to permit data on the lines 24 to pass through a respective one of the logic circuits 16 to a respective one of the registers 10 when an appropriate command is present, it is necessary to connect all of the data inputs of the register control circuit 14 to ground potential during the first timing phase, so that the presence or absence of a command can be sensed. This is performed by a plurality of FET's 26, 26a-26n, having their gate electrodes connected to the PH1 signal. The logic circuits 16 will be better understood from the following description of FIGS. 2-5.

With reference to FIG. 2, there is shown one embodiment of the logic circuits 16 illustrated in FIG. 1. The logic circuit 16 illustrated in FIG. 2 is supplied with recirculation data on the line 20 and with input data on the line 24 and supplies data to a respective one of the registers 10 on a line 28. The line 20 is connected through a pair of series connected transfer gates 30 and 32 to the line 28. The transfer gates 30 and 32 are in the form of FET's. The source of the FET 30 is connected through a capacitor 34 to ground potential which represents the inherent capacitance of the FET 30. The gate electrode of the FET 30 is connected to the PH2 signal.

The line 24 is connected through a transfer gate 36 in the form of an FET to the line 28. The source of the FET 36 is connected through a capacitor 38 to ground potential, which capacitor represents the inherent capacitance of the FET's 32 and 36 and inverter 72. The gate electrode of the FET 36 is also connected to the PH2 signal. The line 24 is also connected through a transfer gate 40 in the form of an FET to the gate electrode of the FET 32. A capacitor 42 from the source of the FET 40 to ground potential represents the inherent capacitance of the FET 40 and the gate-to-ground capacitance of the FET 32. The gate electrode of the FET 40 is connected to the PH1 signal.

FIG. 6C illustrates a typical waveform of one of the command signals on one of the lines 18 supplied to register control circuit 14. The register control PLA 14 is formed of a two groups of NOR gates, with the inputs of the first group being connected to respective inputs of the PLA 14 to form partial product terms at the outputs thereof. The inputs of the second group of NOR gates are connected to respective outputs of the first group, and the outputs thereof are supplied on the lines 24 to the logic circuits 16. When the command signal is at a low level, therefore, no command is present to load data into the registers 10 from the register control circuit 14. However, when the command signal is at a high level (0 level in FIG. 6C), a command will be present to load input data from either the lines 20 or the line 22 through the register control circuit 14 into a respective one of the registers 10. Accordingly, whenever the command signal is at a low level, the signal on the line 24 will remain at a low level regardless of the data supplied to the inputs of the register control circuit 14. It can be appreciated, of course, that only one of a plurality of command signals is shown in FIG. 6.

When the PH1 signal is at a low level, the transfer gate 40 will be rendered conductive to store the signal contained on the line 24 on the capacitor 42. Therefore, if the appropriate command signal is at a low level when the transfer gate 40 is rendered conductive, a low level signal will be stored on the capacitor 42. The low level charge on the capacitor 42 will remain stored thereon until the next occurance of the PH1 signal. That low level charge on the capacitor 42 will render the transfer gate 32 conductive. During the next occurance of the PH2 signal going to a low level, the transfer gate 30 will be rendered conductive, such that the data on the line 20 will be conducted therethrough and through the transfer gate 32 to the line 28. Accordingly, it can be appreciated that whenever a command to load data from the line 24 is not present, data will be recirculated in each of the registers 10. During the conduction of the FET 36, data will also be stored on the capacitor 38. However, this data will, in the recirculation mode, always be a low level signal which will have no effect on the data passing through the FET 32. That is, any data passing through the FET 32 will override that low level charge on the capacitor 38.

FIG. 6D illustrates the idealized waveform of an example of data supplied to an input of the register control circuit 14 when the FET's 26, 26a-26n, illustrated in FIG. 1 are not conducting. FIG. 6E illustrates the idealized waveform of the data supplied to the inputs of the register control circuit 14 when the FET's 26, 26a-26n, are conducting. As shown therein, the inputs are grounded during the PH1 signal. Since any data which is to be recirculated in a particular one of the registers 10 does not pass through the register control circuit 14, the data represented by the waveform illustrated in FIG. 6E will be considered as input data supplied through the register control circuit 14 to one of the lines 24, as opposed to recirculation data. Recirculation data constitutes that data which is supplied directly from an output of each of the registers 10 to an input thereof without passing through the register control circuit 14. Input data, however, constitutes that data which is either supplied on the line 22 through the register control circuit 14 to a respective one of the registers 10, or that data which is supplied from one of the registers 10 through the register control circuit 14 to another one of the registers 10.

FIG. 6F illustrates the idealized waveform of an example of recirculation data when the FET's 26, 26a-26n, are not conducting. FIG. 6G illustrates the idealized waveform of recirculation data with the FET 26 shown in FIG. 1 is not conducting. FIG. 6H illustrates the idealized waveform of data supplied to one of the registers 10 in the presence of the command signal illustrated in FIG. 6C and the data signals illustrated in FIGS. 6E and 6G.

When the command signal is at a high level, the FET 32 will remain in a nonconductive state to block the recirculation of data, and input data supplied on the line 24 will be conducted through the FET 36 to the line 28. However, if the input data also supplied on the line 24 were allowed to be at a low level when the command signal is at a high level at the time that the PH1 signal is at a low level, a low level signal would be stored on the capacitor 42. Accordingly, all of the inputs to the register control circuit 14 are grounded during the time that the PH1 signal is at a low level, to prevent this condition occurring. Therefore, when the command signal is at a high level, the FET 32 will remain nonconductive and input data supplied on the line 24 will be conducted through the FET 36 when the PH2 signal is at a low level. The data supplied to the FET 36 will be stored on the capacitor 38 and subsequently supplied on the line 28 to the first stage of the register 10. It can be appreciated from the above that the logic circuit illustrated in FIG. 2 transmits input data to the corresponding register 10 whenever a command to load such input data is present and recirculates data in that register whenever such a command is not present.

The logic circuit 16 illustrated in FIG. 2 may be some what difficult to implement, because it may not be possible to attain a sufficient amount of drive to the gate of the FET 32. This difficulty can be overcome by the circuit illustrated in FIG. 3 in which a pair of inverter states 44 and 46 are connected between the capacitor 42 and the gate electrode of the FET 32. In this embodiment, the capacitor 42 represents the inherent capacitance of the FET 40 and of the inverter 44. The inverter stages 44 and 46 are well known circuits and require no further explanation. The logic circuits 16 illustrated in FIGS. 2 and 3 may also be difficult to implement because of the transfer gate 32. The logic circuits illustrated in FIGS. 4 and 5 eliminate the transfer gate 32.

The logic gates illustrated in FIGS. 4 and 5 accept a low level signal (negative) as a binary "1" and a high level signal (ground or positive) as a binary "0". As shown in FIG. 4, the source of the FET 40 is connected through an inverter 48 to the drain of a transfer gate 50 in the form of an FET. The inherent capacitance of the FET 50 is represented by a capacitor 52 connected from the source of the FET 50 to ground potential. The gate of the FET 50 is connected to the PH2 signal. The source of the FET 50 is connected to one input of an OR gate 54 and the source of the FET 30 is connected to the other input thereof. The output of the OR gate is connected to one input of a NAND gate 56 and the source of the FET 36 is connected to the other input of the NAND gate 56.

When a command to load input data is not present on the line 24, a low level charge will be stored on the capacitor 42 when the PH1 signal is at a low level. This low level charge will be inverted by the inverter 48 and a high level signal will be stored on the capacitor 52 when the PH2 signal is at a low level. Accordingly, when a command to load input data is not present on the line 24, a high level charge will be stored on the capacitor 52 such that any recirculation data stored on the capacitor 34 will be transmitted through the OR gate 54 to the NAND gate 56. Also, when a command to load input data is not present on the line 24, a low level charge will be stored on the capacitor 38 whenever the PH2 signal is at a low level. The low level charge on the capacitor 38 will permit recirculation data at the output of the OR gate 54 to be transmitted through the NAND gate 56 to the line 28.

When a command to load input data is present on the line 24, a low level signal will be supplied from the capacitor 52 to the OR gate 54, such that the output of the OR gate 54 will remain at a low level. Accordingly, any recirculation data stored on the capacitor 34 will not be transmitted through the OR gate 54 to the NAND gate 56. However, because of the low level signal at the output of the OR gate 54, any input data stored on the capacitor 38 will be transmitted through the NAND gate 56 to the line 28.

The OR gate 54 and NAND gate 56 form a complex gate which may not be desirable. The logic circuit 16 illustrated in FIG. 5 eliminates the complex gate represented by the OR gate 54 and NAND gate 56 in FIG. 4.

As shown in FIG. 5, the logic circuit includes an AND gate 58 having its inputs inverted, with one of its inputs connected to the source of the FET 30 and its other input connected to the source of the FET 50. An output of the AND gate 58 is connected through a transfer gate 60 in the form of an FET to one input of a NOR gate 62. A capacitor 64 connected between the source of the FET 60 and ground potential represents the inherent capacitance of the FET 60. The gate of the FET 60 is connected to the PH1 signal. Also, the source of the FET 36 is connected through an inverter 66 to the drain of an FET 68 having its source connected to the other input of the NOR gate 62. A capacitor 70 represents the inherent capacitance of the FET 68. The gate of the FET 68 is connected to the PH1 signal.

When a command to load input data is not present on the line 24, a low level signal will be stored on the capacitor 42 when the PH1 signal is at a low level. This low level signal will be inverted by the inverter 48 and supplied through the FET 50 when the PH2 signal is at a low level to the capacitor 52. Also, when the PH2 signal is at a low level, the FET's 30 and 36 will be rendered conductive to store recirculation data on the capacitor 34 and to store the low level signal contained on the line 24 on the capacitor 38. Under these conditions, the recirculation data stored on the capacitor 34 will be transmitted to an output of the AND gate 58 and supplied through the transfer gate 60 to one input of the NOR gate 62 when the PH1 signal is at a low level. The low level signal stored on the capacitor 38 will be inverted by the inverter 66 and stored on the capacitor 70 when the PH1 signal is at a low level. Accordingly, recirculation data supplied at the source of the FET 60 will be transmitted through the NOR gate 62 to the line 28.

When a command to load input data is present on the line 24, a high level signal will be stored on the capacitor 42. This high level signal will be inverted to supply a low level signal to the inverted input of the AND gate 58, thereby blocking the transmission of recirculation data therethrough. Input data, however, will be stored on the capacitor 38 and will be transmitted through the inverter 66, transfer gate 68, and NOR gate 62 to the line 28.

The transfer gate 30 in FIGS. 2-5 effectively stores one-half bit of data. Also, the transfer gate 36 effectively stores one-half bit of data. Accordingly, if the registers of a processor employing the invention illustrated in FIGS. 2-4 are to be 48 bit registers, the registers 10 would have a capacity of 47½ bits, with the other one-half bit being contained in the transfer gates 30 and 36. Because an inversion of this one-half bit is required, an inverter 72 is connected between the source electrodes of the FET's 32 and 36 and the line 28 in the embodiments illustrated in FIGS. 2 and 3. In the embodiment illustrated in FIG. 4, however, such an inversion occurs through the NAND gate 56.

In the embodiment illustrated in FIG. 5, another one-half bit of data will be contained in the transfer gate 60 in the recirculation path and one-half bit of data will be contained in the transfer gate 68 in the input data path. Accordingly, the circuit of FIG. 5 has a capacity of one bit of data in each path, and, therefore, the register 10 associated therewith need only have a capacity of 47 bits in the above example.

It can be appreciated from the above that the present invention performs a recirculate function with a minimum number of components, particularly when it is considered that a part of the storage capacity of the registers associated therewith is contained in the logic circuits 16. Also, the recirculation function performed by the present invention does not require the generation of a separate command to perform that function. Furthermore, recirculation data does not pass through the register control circuit 14, such that the control circuit may be considerably smaller than that required in prior known interconnect circuits. Although the invention has been described in conjunction with a register control circuit in the form of a PLA, it is to be understood that the present invention may be employed with any interconnect logic in which a command signal and input data are effectively ANDed at an output thereof and supplied to a register. Furthermore, the present invention has been described as being implemented with P MOS circuits, but it is to be understood that the present invention can be implemented with positive logic circuits such as with N MOS circuits, if the signal levels discussed above are inverted. Furthermore, if such positive logic is employed, the PLA 14 would be implemented with NAND gates rather than NOR gates.

An important feature of the present invention resides in the separation of commands from input data at the outputs of the register control circuit 14 during the first timing phase, PH1. That is, by disconnecting input data from the inputs of the PLA 14 during the PH1 timing phase, only commands will be sensed at the outputs of the PLA 14. Accordingly, the present invention also includes the method of separating the different components of the signals forming the outputs of a logic circuit, such that one or more of those components can be sensed separately from the other components thereof. In the present exemplification of the present invention, input data signals are disconnected (by grounding each) upon the occurance of the PH1 signal, such that only command signals will be sensed during that timing phase.

The present invention may be employed in any apparatus in which data is to be recirculated. For example, the present invention can be employed in serial processors, such as calculators, and the like machines. Also, the present invention can be used with parallel processors by employing as many of the logic circuits 16 as there are parallel data lines.

The invention claimed is:

1. An interconnect circuit for supplying data to a register comprising
   (a) first means responsive to at least one command and to input data from external sources connected to respective inputs to said first means for supplying said command and simultaneously inhibiting said input data during a first time period and supplying said input data during a second time period at an output of said first means upon the condition that said one command is present during said first time period,
   (b) second means connected to said output for supplying said input data during said second time period to an input of said register upon the condition that said one command is present during said first time period and for supplying recirculation data to an input of said register, upon the condition that said one command is not present during said first time period, said recirculation data being derived at an output of said register; and (c) timing means connected to said first and second means for generating timing signals corresponding to said first and second time periods.

2. The interconnect logic of claim 1, wherein said second means includes a first transfer gate having inherent capacitance for storing data, said first transfer gate being connected to an output of said register, means for connecting an output of said first transfer gate to an input of said register, a second transfer gate for enabling said connecting means, connected between an output of said first means and said connecting means, and means for enabling said first transfer gate during said first time period and said second transfer gate during a second time period.

3. The interconnect logic of claim 2, further comprising a third transfer gate connected between an output of said first means and the input of said register, said enabling means further including means for enabling said third transfer gate during said second time period.

4. The interconnect logic of claim 3, wherein said connecting means includes a fourth transfer gate.

5. The interconnect logic of claim 4, wherein said second means further includes a pair of inverters connected between said second transfer gate and said fourth transfer gate.

6. The interconnect logic of claim 3, wherein said connecting means includes an OR gate.

7. The interconnect logic of claim 6, wherein said second means includes a fourth transfer device and a first inverter connected in series with one another and from an output of said second transfer gate to one input of said OR gate.

8. The interconnect logic of claim 7, wherein said second means includes a NAND gate having one input connected to an output of said OR gate, a second input connected to an output of said third transfer gate, and an output connected to the input of said register.

9. An interconnect circuit for supplying data to a register comprising
(a) first means responsive to at least one command and to input data from external sources connected to respective inputs to said first means for supplying said command and simultaneously inhibiting said input data during a first time period and supplying said input data during a second time period at an output of said first means upon the condition that said one command is present during said first time period,
(b) second means connected to said output for supplying said input data to an input of said register during said second time period upon the condition that said one command is present during said first time period and for supplying recirculation data to an input of said register during said second time period upon the condition that said one command is not present during said first time period, said recirculation data being derived at an output of said register;
(c) timing means connected to said first and second means for generating a pair of timing signals which are out of phase with one another and correspond to said first and second time periods; and
(d) means responsive to one of said timing signals for disabling said input data from being active at an input of said first means;
said second means including:
a first transfer gate connected between the output of said register and the input of said register, a second transfer gate connected to an output of said first means and responsive to said one timing signal for enabling said first transfer gate, and
means connected between said first and said second transfer gates for storing a signal transmitted through said second transfer gate from said first means.

10. The interconnect circuit of claim 9, wherein said second means includes a first transfer gate responsive to a first timing phase signal and connected to an output of said register, means for connecting said first transfer gate to an input of said register, a second transfer gate responsive to a second timing phase signal and connected to the output of said first means for enabling said connecting means in response to the absence of said one command at the output of said first means, and a third transfer gate responsive to said first timing phase signal and connected from the output of said first means to the input of said register.

11. The interconnect circuit of claim 10, wherein said connecting means includes a transfer gate.

12. The interconnect circuit of claim 10, wherein said connecting means includes an OR gate.

13. The interconnect logic of claim 9, wherein said second means further includes means for storing an output signal from said first means, and means responsive to said storing means for enabling said first transfer gate during a second time period which occurs after said first time period.

14. The interconnect logic of claim 13, further comprising means for connecting an output of said first transfer gate to an input of said register, said enabling means including means for enabling said first transfer gate during said second timing phase, said first transfer gate including means for storing an output signal from said register when said first transfer date is enabled, and said storing means including means for enabling said connecting means upon the condition that a command is present at said output during said first timing phase.

* * * * *